United States Patent
Matsuoka et al.

(10) Patent No.: US 10,410,908 B2
(45) Date of Patent: Sep. 10, 2019

(54) SUBSTRATE PROCESSING APPARATUS AND SUBSTRATE HOLDING DEVICE

(71) Applicant: SCREEN Holdings Co., Ltd., Kyoto (JP)

(72) Inventors: Hiromitsu Matsuoka, Kyoto (JP); Tomomi Iguchi, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 0 days.

(21) Appl. No.: 15/895,165

(22) Filed: Feb. 13, 2018

(65) Prior Publication Data
US 2018/0247854 A1 Aug. 30, 2018

(30) Foreign Application Priority Data

Feb. 28, 2017 (JP) .................. 2017-036726

(51) Int. Cl.
H01L 21/683 (2006.01)
C23C 16/458 (2006.01)
C23C 14/50 (2006.01)
B25B 11/00 (2006.01)
H01L 21/67 (2006.01)
H01L 21/687 (2006.01)

(52) U.S. Cl.
CPC ........ H01L 21/6838 (2013.01); B25B 11/005 (2013.01); C23C 14/505 (2013.01); C23C 16/4584 (2013.01); H01L 21/67126 (2013.01); H01L 21/6875 (2013.01)

(58) Field of Classification Search
CPC ............ B25B 11/005; B01L 21/67126; H01L 21/67126; H01L 21/6875; H01L 21/6838; H01L 21/68735; C23C 14/505; C23C 16/4584; B23B 31/307
See application file for complete search history.

(56) References Cited

U.S. PATENT DOCUMENTS 5,534,073 A * 7/1996 Kinoshita ............. B25B 11/005
                                                    118/725
5,885,404 A * 3/1999 Kim .................. H01L 21/68735
                                                    118/500

(Continued)

FOREIGN PATENT DOCUMENTS

JP    2007-019317 A    1/2007
JP    2012-119464 A    6/2012

Primary Examiner — Eric A. Gates
Assistant Examiner — Paul M Janeski
(74) Attorney, Agent, or Firm — Ostrolenk Faber LLP

(57) ABSTRACT

A plate-like base of a substrate holder has an upper surface perpendicular to a central axis. A supporter is disposed circumferentially around the central part of the base and protrudes upward from the upper surface of the base to support the lower surface of a substrate. A flexible seal is disposed around the entire periphery of the supporter. An upper edge portion of the seal is located above the supporter. When the substrate holder adsorbs a substrate, gas present between the base and the substrate is sucked through a suction port with the upper edge portion of the seal being in contact with the lower surface of the substrate. This allows the substrate to approach the base and come in contact with the supporter while making the seal bend down. As a result, even if there is a warp in a substrate, the substrate can be held suitably.

12 Claims, 4 Drawing Sheets

(56) References Cited

U.S. PATENT DOCUMENTS

| | | | | |
|---|---|---|---|---|
| 6,149,727 | A | * | 11/2000 | Yoshioka ................ B05C 11/08 |
| | | | | 118/320 |
| 6,279,976 | B1 | | 8/2001 | Ball ............................ 294/64.1 |
| 7,483,119 | B2 | | 1/2009 | Owa et al. ...................... 355/53 |
| 2007/0026772 | A1 | * | 2/2007 | Dolechek ................ B24B 7/228 |
| | | | | 451/388 |
| 2012/0154313 | A1 | * | 6/2012 | Au ...................... G06F 3/04883 |
| | | | | 345/173 |
| 2015/0050863 | A1 | | 2/2015 | Miyazaki et al. ............. 451/41 |

\* cited by examiner

SUBSTRATE PROCESSING APPARATUS AND SUBSTRATE HOLDING DEVICE

TECHNICAL FIELD

The present invention relates to a substrate processing apparatus and a substrate holding device.

BACKGROUND ART

A mechanism for adsorbing and holding a substrate has conventionally been used in the process of manufacturing semiconductor substrates (hereinafter, simply referred to as "substrates"). When there is a warp in a substrate, the mechanism for adsorbing and holding a substrate may not be able to adsorb the substrate suitably.

In view of this, Japanese Patent Application Laid-Open No. 2012-119464 (Document 1) proposes a wafer holding device that adsorbs a substrate after correcting a warp in the substrate. Specifically, the wafer holding device holds a wafer on the upper edge portion of a cup-shaped suction guard by suction and moves the suction guard down so as to press the wafer against a flat plate-like correcting part disposed in the suction guard. Accordingly, the warp in the wafer is corrected, and the shape of the wafer is approximated to a flat shape. Thereafter, a suction chuck is moved upward to come in contact with the lower surface of the wafer so that the wafer is adsorbed and held by the suction chuck.

The wafer holding device of Document 1 requires various configurations for adsorbing a wafer after correcting a warp in the wafer and also requires a mechanism for moving such configurations up and down individually. Thus, the device structure may be complicated. When there is a relatively large warp in a wafer, the wafer may be damaged in the process of pressing the wafer against the correcting part to correct the warp in the wafer.

SUMMARY OF INVENTION

The present invention is directed to a substrate processing apparatus for processing a substrate, and it is an object of the present invention to suitably hold a substrate even if there is a warp in the substrate.

A substrate processing apparatus according to the present invention includes a substrate holder configured to hold a substrate in a horizontal position from below, an absorber configured to suck gas present between the substrate holder and the substrate to allow the substrate holder to adsorb the substrate, and a substrate rotator configured to rotate the substrate holder about a central axis pointing in an up-down direction. The substrate holder includes a plate-like base having an upper surface perpendicular to the central axis, a suction port that is arranged in the upper surface of the base and connected to the absorber, a supporter that is disposed circumferentially around a central part of the base and protrudes upward from the upper surface of the base to support a lower surface of the substrate, and a flexible seal that is disposed around an entire periphery of the supporter and has an upper edge portion located above the supporter. When the substrate holder adsorbs the substrate, the gas present between the base and the substrate is sucked through the suction port with the upper edge portion of the seal being in contact with the lower surface of the substrate, to allow the substrate to approach the base and come in contact with the supporter while making the seal bend down. Accordingly, even if there is a warp in a substrate, the substrate can be held suitably.

According to a preferred embodiment of the present invention, the seal is a ring-shaped plate member that extends upward as a distance from the supporter increases.

According to another preferred embodiment of the present invention, the supporter includes an inner supporter that is disposed circumferentially adjacent to an outer periphery of the central part of the base, and the inner supporter includes a plurality of linear parts, each having an arc shape centered on the central axis.

According to another preferred embodiment of the present invention, the supporter includes an inner supporter that is disposed circumferentially adjacent to an outer periphery of the central part of the base, and the inner supporter includes a plurality of protrusions that come in point contact with the lower surface of the substrate.

According to another preferred embodiment of the present invention, the supporter includes an inner supporter that is disposed circumferentially adjacent to an outer periphery of the central part of the base, and an outer supporter that is disposed circumferentially adjacent to an inner periphery of the seal.

More preferably, the outer supporter has an upper end located above an upper end of the inner supporter.

According to another preferred embodiment of the present invention, a portion of the seal that comes in contact with the substrate has a surface made of a fluorocarbon resin or a silicone resin.

According to another preferred embodiment of the present invention, the supporter and the base are made of a conductive material.

The present invention is also directed to a substrate holding device for holding a substrate in a horizontal position from below. The substrate holding device according to the present invention includes a plate-like base having an upper surface perpendicular to a central axis pointing in an up-down direction, a suction port that is arranged in the upper surface of the base and connected to an absorber configured to suck gas present between the base and a substrate, a supporter that is disposed circumferentially around a central part of the base and protrudes upward from the upper surface of the base to support a lower surface of the substrate, and a flexible seal that is disposed around an entire periphery of the supporter and has an upper edge portion located above the supporter. When the substrate is adsorbed, the gas present between the base and the substrate is sucked through the suction port with the upper edge portion of the seal being in contact with the lower surface of the substrate, to allow the substrate to approach the base and come in contact with the supporter while making the seal bend down. Accordingly, even if there is a warp in a substrate, the substrate can be held suitably.

These and other objects, features, aspects and advantages of the present invention will become more apparent from the following detailed description of the present invention when taken in conjunction with the accompanying drawings.

DESCRIPTION OF EMBODIMENTS

Figure 1:
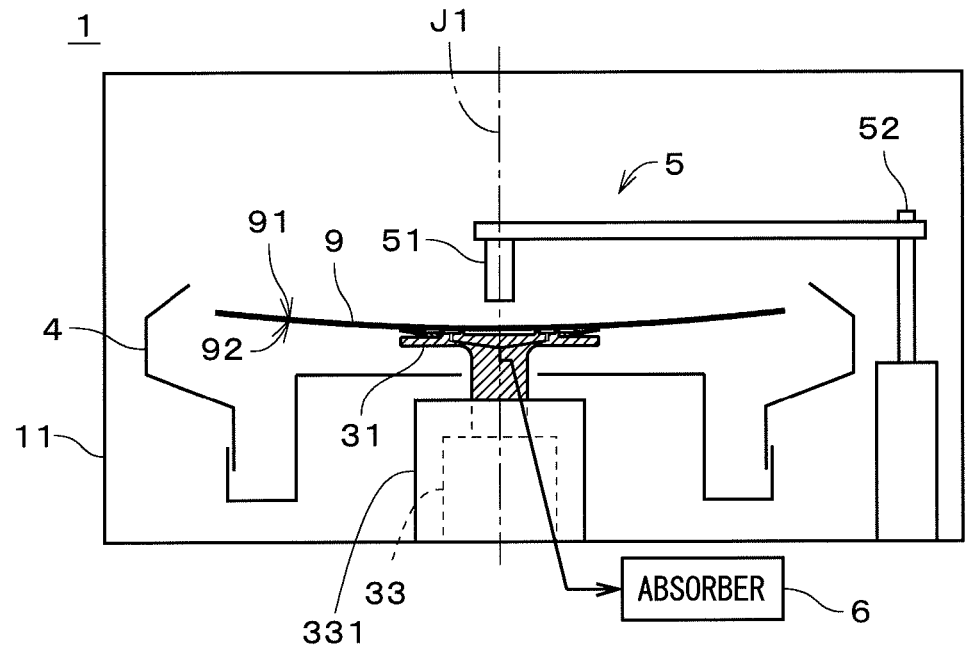
FIG. 1 illustrates a configuration of a substrate processing apparatus according to an embodiment.

FIG. 1 illustrates a configuration of a substrate processing apparatus 1 according to an embodiment of the present invention. The substrate processing apparatus 1 is a single wafer processing apparatus for processing semiconductor substrates 9 (hereinafter, simply referred to as "substrates 9") one at a time. The substrate processing apparatus 1 performs processing by supplying a processing liquid to the substrates 9. FIG. 1 illustrates part of the configuration of the substrate processing apparatus 1 in cross section.

The substrate processing apparatus 1 includes a chamber 11, a substrate holder 31, a substrate rotator (i.e. rotation mechanism) 33, a cup part 4, a processing liquid supply part 5, and an absorber (i.e. a suction part) 6. The constituent elements such as the substrate holder 31 and the cup part 4 are housed in the chamber 11.

The substrate holder 31 is a chuck that includes a generally disc-like portion and a generally columnar portion, both centered about a central axis J1 pointing in the up-down direction. A substrate 9 is disposed on the substrate holder 31. The substrate 9 is adsorbed and held in a generally horizontal position from the underside by the substrate holder 31 in the chamber 11. In the example illustrated in FIG. 1, the substrate 9 is warped downward in a convex shape. In other words, the central part of the substrate 9 is concaved downward. The absorber 6 is connected to the substrate holder 31. The absorber 6 sucks a gas (e.g., air) present between the substrate holder 31 and the substrate 9 to allow the substrate holder 31 to adsorb the substrate 9.

The substrate rotator 33 is disposed below the substrate holder 31. The substrate rotator 33 rotates the substrate 9 along with the substrate holder 31 about the central axis J1. The substrate rotator 33 is housed in a rotator housing part 331 having a generally cylindrical covered shape.

The processing liquid supply part 5 supplies a processing liquid to the substrate 9. The processing liquid supply part 5 includes a nozzle 51 and a nozzle rotator (rotation mechanism) 52. The nozzle 51 ejects the processing liquid toward an upper surface 91 that is an upper main surface of the substrate 9. The nozzle rotator 52 moves the nozzle 51 generally horizontally above the substrate 9. In the substrate processing apparatus 1, for example, the nozzle rotator 52 moves the nozzle 51 continuously and reciprocally between a position above the central part of the substrate 9 and a position above the outer edge of the substrate 9, while the processing liquid is ejected from the nozzle 51 to the substrate 9 that is being rotated by the substrate rotator 33. Accordingly, the processing liquid is supplied to the entire upper surface 91 of the substrate 9. Alternatively, in the substrate processing apparatus 1, the processing liquid may be supplied to the substrate 9 from the nozzle 51 that remains at rest above the central part of the substrate 9. As another alternative, the processing liquid supply part 5 may include a lower nozzle that is disposed below the substrate 9 and supplies a processing liquid to a lower surface 92 that is a lower main surface of the substrate 9.

The cup part 4 is a ring-shaped cup centered about the central axis J1 and is disposed around the substrate 9 and the substrate holder 31. The cup part 4 receives the processing liquid dispersed from the rotating substrate 9 to the surroundings. The processing liquid received by the cup part 4 is discharged to the outside of the chamber 11 through a drain port (not shown) that is provided in the lower edge portion of the cup part 4.

Figure 2:
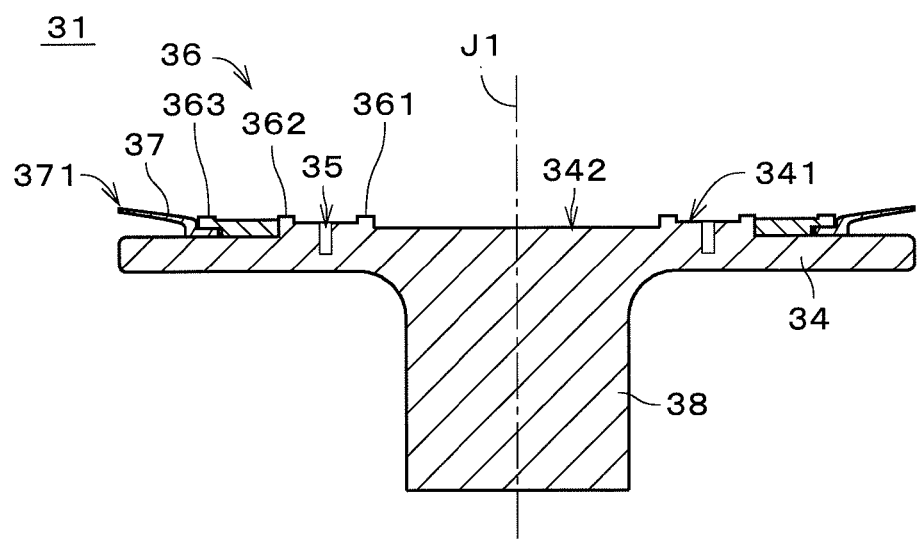
FIG. 2 is a cross-sectional view of a substrate holder.
Figure 3:
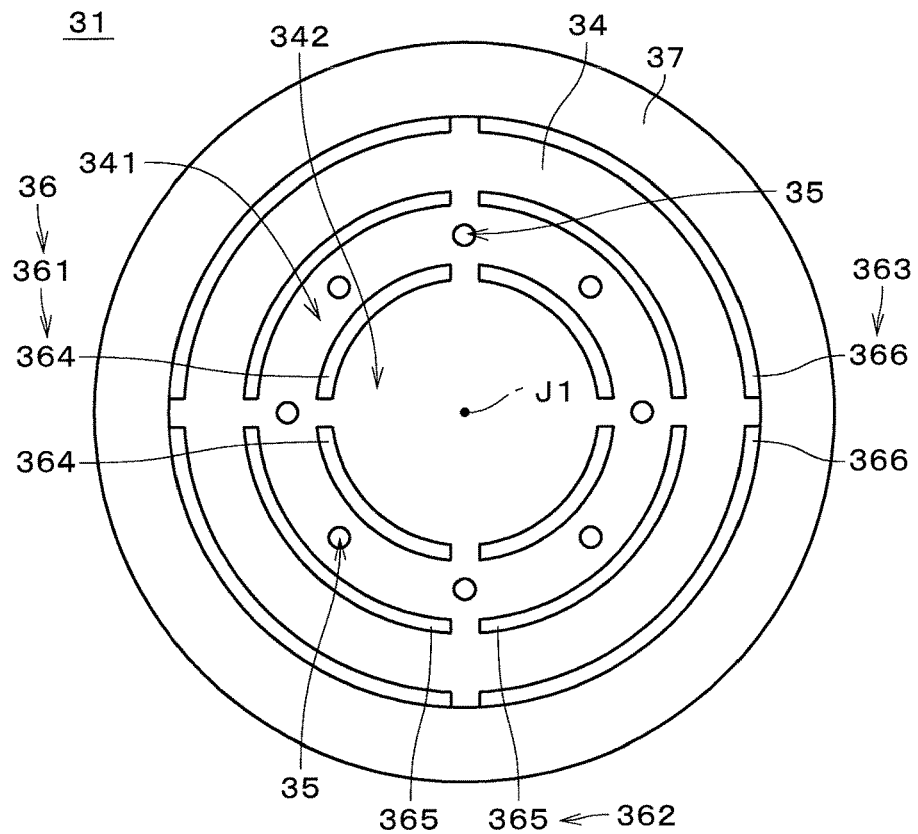
FIG. 3 is a plan view of the substrate holder.

FIG. 2 is an enlarged cross-sectional view of the substrate holder 31. FIG. 3 is a plan view of the substrate holder 31. The substrate holder 31 includes a base 34, suction ports 35, a supporter 36, a seal (a seal part) 37, and a base foundation 38. The base 34 is a generally disc-like portion centered about the central axis J1. The base 34 has an upper surface 341 generally perpendicular to the central axis J1. The diameter of the base 34 may be greater than or equal to 20% of and less than or equal to 100% of the diameter of the substrate 9 (see FIG. 1) held by the substrate holder 31. In the example illustrated in FIGS. 1 and 2, the diameter of the substrate 9 is approximately 300 mm, and the diameter of the base 34 is approximately 100 mm.

The base foundation 38 is a generally columnar portion centered about the central axis J1. The base foundation 38 is connected to the lower surface of the base 34 and supports the base 34 from the underside. The diameter of the base foundation 38 is smaller than the diameter of the base 34. In the example illustrated in FIG. 2, the base foundation 38 and the base 34 form an integral member.

The supporter 36 protrudes upward from the upper surface 341 of the base 34 and supports the lower surface 92 of the substrate 9 from the underside. The supporter 36 is disposed circumferentially (i.e., in a generally ring shape) around a central part 342 of the base 34. The supporter 36 is disposed while avoiding the central part 342 of the base 34. In other words, the central part 342 of the base 34 has no protrusions that protrude upward. This configuration helps prevent the warped substrate 9 from being damaged as a result of being pressed against the protrusions.

The central part 342 of the base 34 is a portion of the base 34 that is located within a circle centered about the central axis J1 and having a predetermined diameter. The diameter of the central part 342 of the base 34 may be greater than or equal to 20% of and less than or equal to 50% of the diameter of the base 34. The diameter of the central part 342 of the base 34 may also be greater than or equal to 5% of and less than or equal to 20% of the diameter of the substrate 9. In the example illustrated in FIG. 2, the diameter of the central part 342 of the base 34 is approximately 40 mm and approximately equal to the diameter of the base foundation 38.

The supporter 36 includes a first supporter 361, a second supporter 362, and a third supporter 363. The first supporter 361, the second supporter 362, and the third supporter 363 are generally circumferential portions that protrude upward from the upper surface 341 of the base 34. In the example illustrated in FIG. 2, the upper ends of the first supporter 361, the second supporter 362, and the third supporter 363 are at approximately the same position in the up-down direction. The distance in the up-down direction between the upper end of the first supporter 361 and the upper surface 341 of the base 34 is, for example, approximately 2 mm.

The first supporter 361, the second supporter 362, and the third supporter 363 are disposed concentrically about the central axis J1. The first supporter 361 is located inward of the second supporter 362 in a radial direction about the central axis J1 (hereinafter, simply referred to as a "radial direction" or "radially"). The second supporter 362 is located inward of the third supporter 363 in the radial direction. In other words, the first supporter 361 is an inner supporter that is located most radially inward in the supporter 36. The third supporter 363 is an outer supporter that is located most radially outward in the supporter 36. The second supporter 362 is an intermediate supporter that is located between the first supporter 361 and the third supporter 363.

The first supporter 361 is disposed generally circumferentially adjacent to the outer circumference of the central part of the base 34. In other words, the inner diameter of the first supporter 361 is equal to the outer diameter of the central part 342 of the base 34. The first supporter 361 includes a plurality of linear parts 364. Each of the linear parts 364 has a generally arc shape centered about the central axis J1 and protrudes upward from the upper surface 341 of the base 34. In the example illustrated in FIG. 3, four linear parts 364 are generally equiangularly spaced from one another in a circumferential direction centered about the central axis J1 (hereinafter, simply referred to as a "circumferential direction" or "circumferentially"). The circumferential length of each linear part 364 may be greater than the gap between two circumferentially adjacent linear parts 364. In the example illustrated in FIG. 3, the radial width of the first supporter 361 (i.e., width of each linear part 364) is approximately 2 mm, and the outer diameter of the first supporter 361 is approximately 40 mm.

The second supporter 362 is disposed generally circumferentially and spaced outward in the radial direction from the first supporter 361. The second supporter 362 includes a plurality of linear parts 365. Each of the linear parts 365 has a generally arc shape centered about the central axis J1 and protrudes upward from the upper surface 341 of the base 34. In the example illustrated in FIG. 3, four linear parts 365 are generally equiangularly spaced from one another in the circumferential direction. The circumferential length of each linear part 365 may be greater than the gap between two circumferentially adjacent linear parts 365. In the example illustrated in FIG. 3, the radial width of the second supporter 362 (i.e., width of each linear part 365) is approximately 2 mm, and the outer diameter of the second supporter 362 is approximately 60 mm.

The third supporter 363 is disposed generally circumferentially and spaced outward in the radial direction from the second supporter 362. The third supporter 363 includes a plurality of linear parts 366. Each of the linear parts 366 has a generally arc shape centered about the central axis J1 and protrudes upward from the upper surface 341 of the base 34. In the example illustrated in FIG. 3, four linear parts 366 are generally equiangularly spaced from one another in the circumferential direction. The circumferential length of each linear part 366 may be greater than the gap between two circumferentially adjacent linear parts 366. In the example illustrated in FIG. 3, the radial width of the third supporter 363 (i.e., width of each linear part 366) is approximately 2 mm, and the outer diameter of the third supporter 363 is approximately 80 mm.

In the substrate holder 31 illustrated in FIG. 2, a generally circular ring plate-like portion of the base 34 that includes the third supporter 363 is formed as a member separated from the other portion of the base 34, and is disposed on and fixed to the other portion by screws or other fasteners. An inner circumferential portion of the generally circular ring-shaped seal 37 is sandwiched in the up-down direction between the portion including the third supporter 363 and the other portion. Accordingly, the seal 37 is fixed to the base 34. Note that the structure for fixing the seal 37 to the base 34 may be modified in various ways. For example, the inner peripheral portion of the seal 37 may be fixed directly to the base 34 by screws or other fasteners.

The base 34, the supporter 36, and the base foundation 38 are made of a hard material that is not weighed down by normal loads. The base 34, the supporter 36, and the base foundation 38 are made of a electrically conductive material. For example, the base 34, the supporter 36, and the base foundation 38 are made of a conductive resin such as conductive PEEK (polyether-ether-ketone). The base 34, the supporter 36, and the base foundation 38 are electrically grounded via, for example, earthed lines.

The upper surface 341 of the base 34 has a plurality of suction ports 35. In the example illustrated in FIG. 3, the suction ports 35 are arranged between the first supporter 361 and the second supporter 362. The suction ports 35 are generally equiangularly aligned in the circumferential direction. Each suction port 35 may have a generally circular shape in plan view. The shape of the suction ports 35 may be modified in various ways. Each suction port 35 is connected to the absorber 6 (see FIG. 1). In order to simplify the drawing, flow paths that connect the suction ports 35 and the absorber 6 are not shown in FIG. 2.

The number of suction ports 35 in the substrate holder 31 may be appropriately changed. For example, the number of suction ports 35 may be one. The positions of the suction ports 35 in the upper surface 341 of the base 34 may be appropriately changed as long as the suction ports 35 are arranged radially inward of the seal 37.

The seal 37 is disposed around the entire circumference of the supporter 36. The seal 37 is a ring-shaped plate member having flexibility. In the example illustrated in FIGS. 2 and 3, the seal 37 has a generally circular ring plate-like shape. The seal 37 is disposed adjacent to the outer circumference of the third supporter 363. In other words, the third supporter 363 is disposed circumferentially adjacent to the inner circumference of the seal 37. Thus, the inner diameter of the seal 37 is equal to the outer diameter of the third supporter 363. The upper end of the inner circumferential portion of the seal 37 circumscribing the third supporter 363 is at approximately the same position in the up-down direction as the upper end of the third supporter 363. A portion of the seal 37 that is radially outward of the third supporter 363 is spaced above from the upper surface 341 of the base 34. In other words, the portion of the seal 37 that is radially outward of the third supporter 363 is not in contact with the base 34.

When the substrate holder 31 adsorbs no substrate 9 (i.e., no deformation occurs in the seal 37) as illustrated in FIG. 2, the seal 37 extends upward as its distance in the radial direction from the supporter 36 increases (i.e., as going radially outward). The thickness of the seal 37 in the up-down direction gradually decreases as the distance from the supporter 36 increases. An upper edge portion 371 of the seal 37 (in the example illustrated in FIG. 2, the outer peripheral portion of the seal 37) is located above the supporter 36. Specifically, the upper edge portion 371 of the seal 37 is located above the upper end of the first supporter 361, the upper end of the second supporter 362, and the upper end of the third supporter 363. The distance in the up-down direction between the upper end of the seal 37 and the upper ends of the first supporter 361, the second supporter 362, and the third supporter 363 may be greater than or equal to 0.5 mm and less than or equal to 3 mm; in the present embodiment, the distance is approximately 1 mm.

The seal 37 is preferably made of a material that has high flexibility, high resistance to chemicals and heat, and low adhesion to the lower surface 92 of the substrate 9 (i.e., having high releasability to the lower surface 92 of the substrate 9). The seal 37 may be made of a fluorocarbon resin or a silicone resin. In the present embodiment, the seal 37 is made of polytetrafluoroethylene (PTFE).

Figure 4:
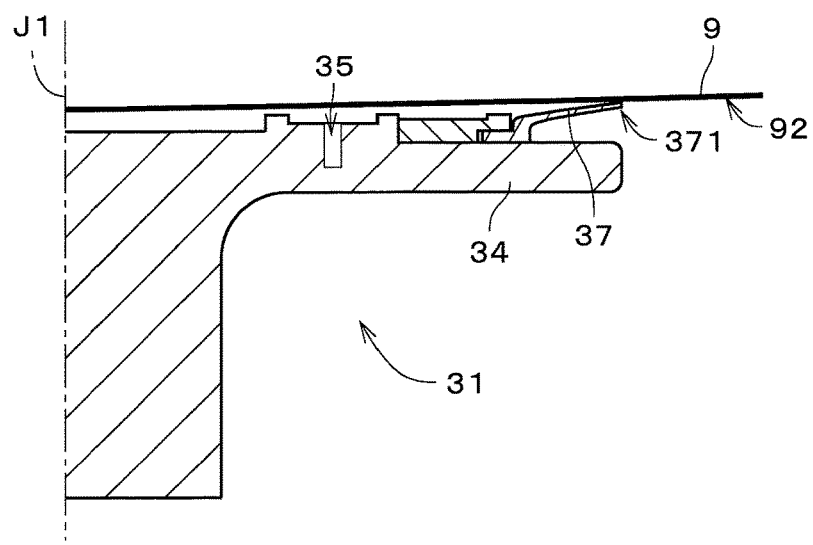
FIG. 4 is a cross-sectional view of the substrate holder.
Figure 5:
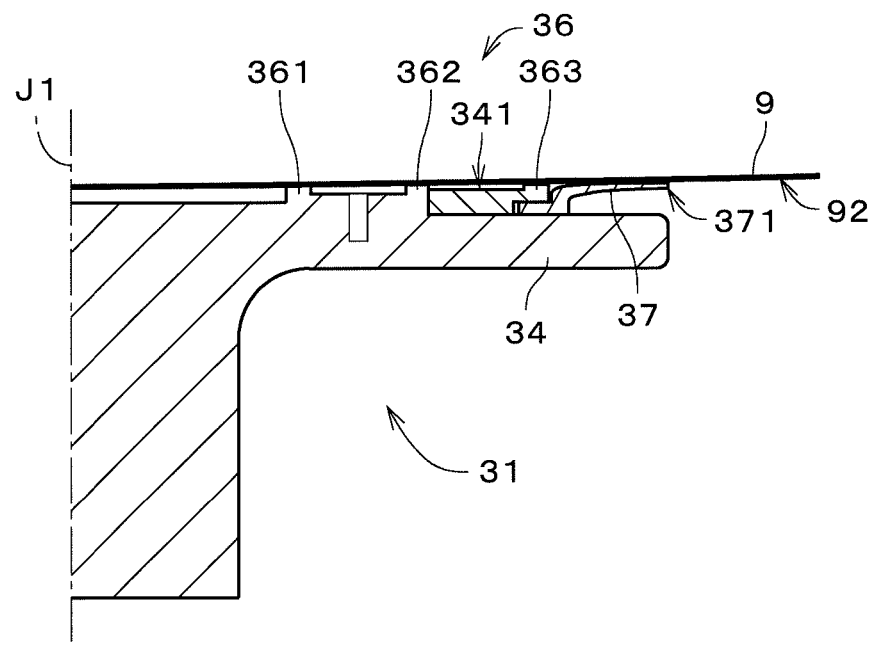
FIG. 5 is a cross-sectional view of the substrate holder.

FIGS. 4 and 5 illustrate how the substrate holder 31 adsorbs the substrate 9. FIGS. 4 and 5 illustrate an enlarged view of the right part of the substrate holder 31 (the same applies to FIGS. 6 and 7, which will be described later). When the substrate 9 is adsorbed by the substrate holder 31, the substrate 9 is first placed on the seal 37, and the upper edge portion 371 of the seal 37 comes in annular contact with the lower surface 92 of the substrate 9 as illustrated in FIG. 4. Accordingly, the space between the lower surface 92 of the substrate 9 and the base 34 and seal 37 of the substrate holder 31 is sealed. At this time, the supporter 36 and the base 34 are spaced below from the lower surface 92 of the substrate 9 and not in contact with the substrate 9.

Then, the absorber 6 (see FIG. 1) is driven so that the gas present in the sealed space between the substrate 9 and both of the base 34 and seal 37 is sucked through the suction ports 35 and discharged to the outside of the sealed space. Accordingly, as illustrated in FIG. 5, the substrate 9 moves downward and approaches the supporter 36 and the base 34 while making the seal 37 bend down. To be more specific, the upper edge portion 371 (i.e., outer peripheral portion) of the seal 37 that is in contact with the substrate 9 moves downward so that the area of contact between the seal 37 and the lower surface 92 of the substrate 9 spreads radially inward from the outer peripheral portion of the seal 37. The seal 37 is deformed along the lower surface 92 of the substrate 9. Note that the main deformation of the seal 37 is a bend in the portion of the seal 37 that is spaced above from the base 34, and this is not compressive deformation produced as a result of the seal 37 being pressed against the base 34.

The downward movement of the substrate 9 and the downward deformation of the seal 37 continue until the substrate 9 comes in contact with the supporter 36. Then, when the substrate 9 has come in contact with the supporter 36, the downward movement of the substrate 9 and the downward deformation of the seal 37 stop, and the substrate 9 is adsorbed and held by the substrate holder 31. With the substrate 9 being adsorbed and held by the substrate holder 31, the lower surface 92 of the substrate 9 is located above the upper surface 341 of the base 34, and the substrate 9 and the base 34 are not in contact with each other. In the example illustrated in FIG. 5, a portion of the seal 37 that is radially outward of the third supporter 363 is spaced above from the base 34. Note that the seal 37 may be in contact with the base 34 in part or in its entirety while the substrate 9 is adsorbed and held by the substrate holder 31.

The substrate 9 may be in contact with all of the first supporter 361, the second supporter 362, and the third supporter 363 or in contact with some of the first supporter 361, the second supporter 362, and the third supporter 363, while the substrate 9 is adsorbed and held by the substrate holder 31. When the central part of the substrate 9 is concaved downward as illustrated in FIG. 5, the lower surface 92 of the substrate 9 is in contact with at least the first supporter 361 of the supporter 36. The shape of the substrate 9 adsorbed and held by the substrate holder 31 may differ from the shape of the substrate 9 before held by the substrate holder 31, or may remain the same.

As described above, the substrate processing apparatus 1 includes the substrate holder 31, the absorber 6, and the substrate rotator 33. The substrate holder 31 holds the substrate 9 in a horizontal position from the underside. The absorber 6 sucks the gas present between the substrate holder 31 and the substrate 9 to allow the substrate holder 31 to adsorb the substrate 9. The substrate rotator 33 rotates the substrate holder 31 about the central axis J1 pointing in the up-down direction. The substrate holder 31 includes the base 34, the suction ports 35, the supporter 36, and the seal 37. The plate-like base 34 has the upper surface 341 perpendicular to the central axis J1. The suction ports 35 are arranged in the upper surface 341 of the base 34 and connected to the absorber 6. The supporter 36 is disposed circumferentially around the central part 342 of the base 34 and protrudes upward from the upper surface 341 of the base 34. The supporter 36 supports the lower surface 92 of the substrate 9. The flexible seal 37 is disposed around the entire circumference of the supporter 36. The upper edge portion 371 of the seal 37 is located above the supporter 36.

When the substrate holder 31 adsorbs the substrate 9, the gas present between the base 34 and the substrate 9 is sucked through the suction ports 35, with the upper edge portion 371 of the seal 37 being in contact with the lower surface 92 of the substrate 9. Accordingly, the substrate 9 approaches the base 34 and comes in contact with the supporter 36 while making the seal 37 bend down.

In this way, in the substrate processing apparatus 1, the downward movement of the substrate 9 under suction by the absorber 6 causes the seal 37 to bend along the lower surface 92 of the substrate 9. Thus, it is possible to maintain the seal in the space between the substrate 9 and both of the base 34 and seal 37 and to always support the substrate 9 with the seal 37. As a result, even if there is a warp in the substrate 9, the substrate 9 can be held suitably with a simple structure. This configuration, for example, helps prevent the substrate 9, when rotated by the substrate rotator 33, from becoming misaligned on the substrate holder 31. The configuration also helps prevent the substrate 9 from being detached from the substrate holder 31 due to the moment produced by collision of the processing liquid when the processing liquid is ejected toward the outer peripheral portion of the substrate 9.

In the substrate holder 31, the seal 37 bends when the substrate 9 approaches the base 34. This configuration also helps prevent the substrate 9 from being excessively pushed upward by the seal 37. As a result, it is possible to prevent the substrate 9 from being damaged when adsorbed and held by the substrate holder 31.

The seal 37 is a ring-shaped plate member that extends upward as its distance from the supporter 36 increases. This configuration simplifies the structure of the seal 37. This configuration also suppresses deformation of the seal 37 in an unintended direction and allows the seal 37 to bend suitably when the substrate 9 is adsorbed by the substrate holder 31. As described above, the thickness of the seal 37 in the up-down direction decreases as the distance from the supporter 36 increases. Thus, the seal 37 can easily be deformed along the substrate 9.

The supporter 36 includes the first supporter 361 (i.e., inner supporter) disposed circumferentially adjacent to the outer circumference of the central part 342 of the base 34. The first supporter 361 includes a plurality of linear parts 364. Each of the linear parts 364 has an arc shape centered about the central axis J1. This configuration relatively increases the area of contact between the first supporter 361 and the lower surface 92 of the substrate 9. As a result, the substrate 9 can be held stably.

In addition to the first supporter 361, the supporter 36 also includes the third supporter 363 (i.e., outer supporter) disposed circumferentially adjacent to the inner circumference of the seal 37. This configuration improves stability in holding the substrate 9.

As described above, the seal 37 is made of a fluorocarbon resin or a silicone resin. This increases the releasability of the seal 37 to the substrate 9. Accordingly, it is possible to avoid a situation where the seal 37 is affixed to the substrate 9 when the substrate 9 is moved from above the substrate holder 31. As a result, the substrate 9 can easily be detached from the substrate holder 31.

In the substrate holder 31, a portion of the seal 37 that comes in contact with the substrate 9 may have a surface made of a fluorocarbon resin or a silicone resin. This configuration increases the releasability of the seal 37 to the substrate 9 and allows the substrate 9 to be easily detached from the substrate holder 31 as described above. In this case, the other portion of the seal 37, excluding the surface of the contact part with the substrate 9, may be made of any various materials having flexibility.

As described above, the supporter 36 and the base 34 are made of a conductive material. Thus, charges in the substrate 9 are dissipated through the supporter 36 and the base 34, while the substrate 9 is held by the substrate holder 31. As a result, the charge accumulated in the substrate 9 can be reduced.

Figure 6:
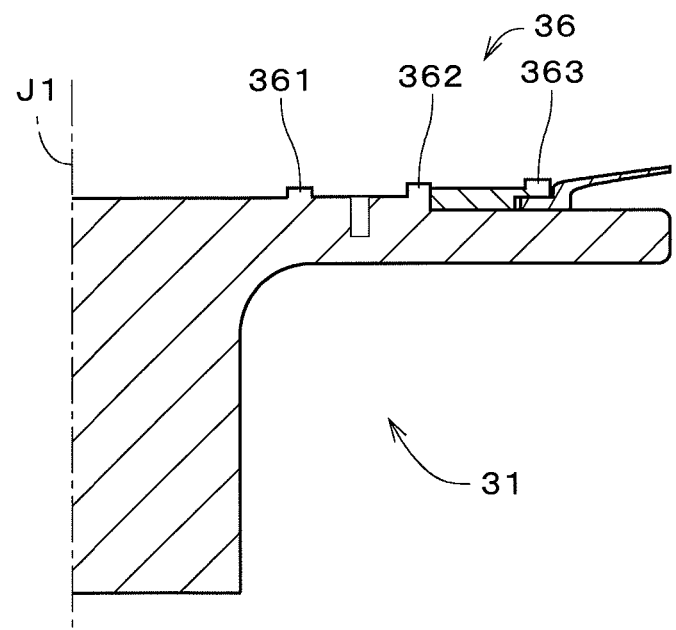
FIG. 6 is a cross-sectional view of the substrate holder.

In the substrate holder 31, the shape of the supporter 36 may be modified in various ways. For example, the upper end of the third supporter 363 may be located above the upper end of the first supporter 361 as illustrated in FIG. 6. This configuration allows both of the first supporter 361 and the third supporter 363 to easily come in contact with the lower surface 92 (see FIG. 2) of the substrate 9 that is warped downward in a convex shape. As a result, it is possible to improve stability in holding the substrate 9 by the substrate holder 31. In the example illustrated in FIG. 6, the upper end of the second supporter 362 is located above the upper end of the first supporter 361 and located below the upper end of the third supporter 363. This configuration allows the second supporter 362 to easily come in contact with the lower surface 92 of the substrate 9 that is warped downward in a convex shape. As a result, it is possible to further improve stability in holding the substrate 9 by the substrate holder 31.

Figure 7:
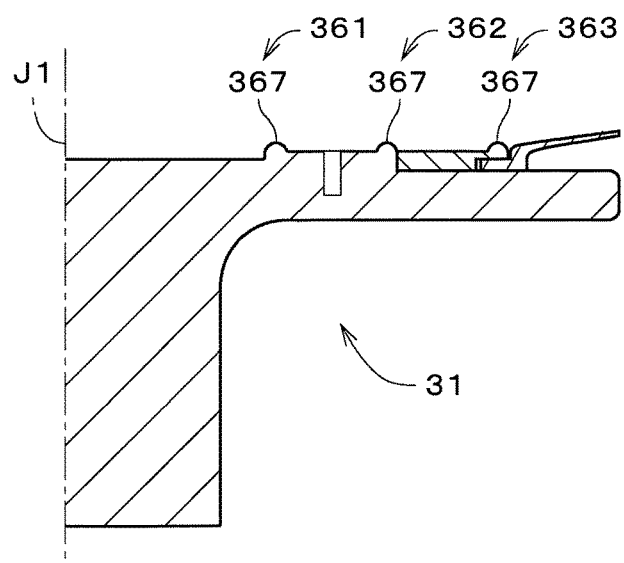
FIG. 7 is a cross-sectional view of the substrate holder.
Figure 8:
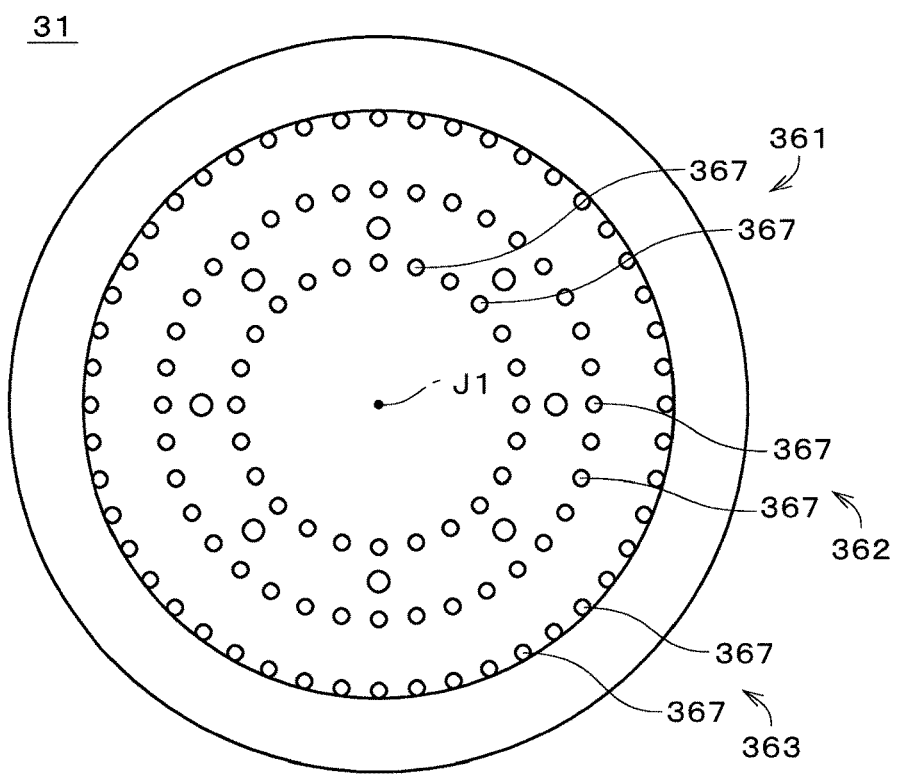
FIG. 8 is a plan view of the substrate holder.

In the substrate holder 31, the first supporter 361 may include a plurality of protrusions 367 that come in point contact with the lower surface 92 of the substrate 9 as illustrated in FIGS. 7 and 8. This configuration relatively increases the number of contact parts between the first supporter 361 and the lower surface 92 of the substrate 9. As a result, the substrate 9 can be held stably. In the example illustrated in FIGS. 7 and 8, the second supporter 362 and the third supporter 363 each also include a plurality of protrusions 367. In each of the first supporter 361, the second supporter 362, and the third supporter 363, the protrusions 367 are generally equiangularly aligned in the circumferential direction. Each protrusion 367 has a generally hemispherical shape. The shape of the protrusions 367 may be modified in various ways. For example, the protrusions 367 may have a mountain shape with an upheaval of the central part as compared with the surroundings. The shape of the protrusions 367 in plan view may be modified in various ways, and may be generally rectangular.

The aforementioned substrate processing apparatus 1 may be modified in various ways.

For example, the shape of the base 34 of the substrate holder 31 is not limited to a disc-like shape, and may be a generally plate-like shape. For example, the base 34 may have a generally rectangular plate-like shape.

The third supporter 363 of the supporter 36 does not necessarily have to be disposed adjacent to the inner circumference of the seal 37, and may be provided at a position that is spaced inward in the radial direction from the inner peripheral edge of the seal 37. The second supporter 362 may be omitted from the supporter 36. The third supporter 363 may also be omitted from the supporter 36.

The shape of the seal 37 may be modified in various ways. For example, the seal 37 may be a circular ring-shaped plate member whose outer peripheral portion is fixed to the base 34 and that extends upward as going inward in the radial direction. The shape of the seal 37 is not limited to a circular ring shape as long as the seal 37 is disposed around the entire circumference of the supporter 36, and the seal 37 may have a generally rectangular ring shape.

The materials for the base 34, the supporter 36, and the base foundation 38 may be appropriately changed. The material for the seal 37 may also be appropriately changed. For example, the seal 37 may be made of a conductive material. In this case, it is possible to further dissipate charges in the substrate 9.

The substrate holder 31 may be used as a substrate holding device for holding a substrate 9 in a horizontal position from the underside, either independently or in various apparatuses (e.g., substrate conveying apparatus) other than the substrate processing apparatus 1. Like the aforementioned substrate holder 31, the substrate holding device includes a base 34, suction ports 35, a supporter 36, and a seal 37. The plate-like base 34 has an upper surface 341 perpendicular to a central axis J1 pointing in the up-down direction. The suction ports 35 are arranged in the upper surface 341 of the base 34 and connected to the absorber 6. The absorber 6 sucks a gas present between the base 34 and the substrate 9. The supporter 36 is disposed circumferentially around the central part 342 of the base 34 and protrudes upward from the upper surface 341 of the base 34. The supporter 36 supports the lower surface 92 of the substrate 9. The flexible seal 37 is disposed around the entire circumference of the supporter 36. The upper edge portion 371 of the seal 37 is located above the supporter 36.

When a substrate 9 is adsorbed, the gas present between the base 34 and the substrate 9 is sucked through the suction ports 35, with the upper edge portion 371 of the seal 37 being in contact with the lower surface 92 of the substrate 9. Accordingly, the substrate 9 approaches the base 34 and comes in contact with the supporter 36 while making the seal 37 bend down. Thus, even if there is a warp in the substrate 9, the substrate 9 can be held suitably as described above.

The aforementioned substrate holding device and the substrate holder 31 of the substrate processing apparatus 1 can also be used to hold a substrate 9 that is flat with no warps and a substrate 9 that is warped upward in a convex shape.

The aforementioned substrate processing apparatus 1 may be used to process glass substrates used in display devices such as liquid crystal displays, plasma displays, and field emission displays (FEDs), instead of semiconductor substrates. Alternatively, the aforementioned substrate processing apparatus 1 may be used to process other substrates such as optical disk substrates, magnetic disk substrates, magneto-optical disk substrates, photomask substrates, ceramic substrates, and solar-cell substrates. The aforementioned substrate holding device may also be used to hold various types of substrates.

The configurations of preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2017-036726 filed in the Japan Patent Office on Feb. 28, 2017, the entire disclosure of which is incorporated herein by reference.

REFERENCE SIGNS LIST

1 Substrate Processing Apparatus
6 Suction part
9 Substrate
31 Substrate holder
33 Substrate rotator
35 Suction port
36 Supporter
37 Seal part
91 Upper surface (of substrate)
92 Lower surface (of substrate)
341 Upper surface (of base)
342 Central part (of base)
361 First supporter
362 Second supporter
363 Third supporter
364, 365, 366 Linear part
367 Protrusion
371 Upper edge portion (of seal)
J1 Central axis

The invention claimed is:

1. A substrate processing apparatus for processing a substrate, comprising:
a substrate holder configured to hold a substrate in a horizontal position from below;
an absorber configured to suck gas present between said substrate holder and said substrate to allow said substrate holder to adsorb said substrate; and
a substrate rotator configured to rotate said substrate holder about a central axis pointing in an up-down direction,
wherein said substrate holder includes:
a plate-like base having an upper surface perpendicular to said central axis;
a suction port that is arranged in said upper surface of said base and connected to said absorber;
a supporter that is disposed circumferentially around a central part of said base and protrudes upward from said upper surface of said base to support a lower surface of said substrate; and
a flexible seal that is disposed around an entire periphery of said supporter and has an upper edge portion located above said supporter, and
wherein said supporter includes:
an inner supporter that is disposed circumferentially adjacent to an outer periphery of said central part of said base; and
an outer supporter that is disposed circumferentially adjacent to an inner periphery of said seal, and
wherein said outer supporter has an upper end located above an upper end of said inner supporter, and
when said substrate holder adsorbs said substrate, the gas present between said base and said substrate is sucked through said suction port with said upper edge portion of said seal being in contact with said lower surface of said substrate, to allow said substrate to approach said base and come in contact with said supporter while making said seal bend down.

2. The substrate processing apparatus according to claim 1, wherein
said seal is a ring-shaped plate member that extends upward as a distance from said supporter increases.

3. The substrate processing apparatus according to claim 1, wherein
said supporter includes an inner supporter that is disposed circumferentially adjacent to an outer periphery of said central part of said base, and
said inner supporter includes a plurality of raised parts, each having an arc shape centered on said central axis and protruding upward from said upper surface of said base.

4. The substrate processing apparatus according to claim 1, wherein
said supporter includes an inner supporter that is disposed circumferentially adjacent to an outer periphery of said central part of said base, and
said inner supporter includes a plurality of protrusions that come in point contact with said lower surface of said substrate.

5. The substrate processing apparatus according to claim 1, wherein
a portion of said seal that comes in contact with said substrate has a surface made of a fluorocarbon resin or a silicone resin.

6. The substrate processing apparatus according to claim 1, wherein
said supporter and said base are made of a conductive material.

7. A substrate holding device for holding a substrate in a horizontal position from below, comprising:
a plate-like base having an upper surface perpendicular to a central axis pointing in an up-down direction;
a suction port that is arranged in said upper surface of said base and connected to an absorber configured to suck gas present between said base and a substrate;
a supporter that is disposed circumferentially around a central part of said base and protrudes upward from said upper surface of said base to support a lower surface of said substrate; and
a flexible seal that is disposed around an entire periphery of said supporter and has an upper edge portion located above said supporter,
wherein said supporter includes:
an inner supporter that is disposed circumferentially adjacent to an outer periphery of said central part of said base; and
an outer supporter that is disposed circumferentially adjacent to an inner periphery of said seal, and
wherein said outer supporter has an upper end located above an upper end of said inner supporter, and
wherein, when said substrate is adsorbed, the gas present between said base and said substrate is sucked through said suction port with said upper edge portion of said seal being in contact with said lower surface of said substrate, to allow said substrate to approach said base and come in contact with said supporter while making said seal bend down.

8. The substrate holding device according to claim 7, wherein
said seal is a ring-shaped plate member that extends upward as a distance from said supporter increases.

9. The substrate holding device according to claim 7, wherein
said supporter includes an inner supporter that is disposed circumferentially adjacent to an outer periphery of said central part of said base, and said inner supporter includes a plurality of raised parts, each having an arc shape centered on said central axis and protruding upward from said upper surface of said base.

10. The substrate holding device according to claim 7, wherein said supporter includes an inner supporter that is disposed circumferentially adjacent to an outer periphery of said central part of said base, and said inner supporter includes a plurality of protrusions that come in point contact with said lower surface of said substrate.

11. The substrate holding device according to claim 7, wherein a portion of said seal that comes in contact with said substrate has a surface made of a fluorocarbon resin or a silicone resin.

12. The substrate holding device according to claim 7, said supporter and said base are made of a conductive material.

* * * * *